(12) United States Patent
Min et al.

(10) Patent No.: US 8,031,009 B2
(45) Date of Patent: Oct. 4, 2011

(54) FREQUENCY CALIBRATION LOOP CIRCUIT

(75) Inventors: Byung Hun Min, Gunsan (KR); Ja Yol Lee, Daejeon (KR); Seong Do Kim, Daejeon (KR); Cheon Soo Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 70 days.

(21) Appl. No.: 12/581,105

(22) Filed: Oct. 16, 2009

(65) Prior Publication Data

US 2010/0134192 A1    Jun. 3, 2010

(30) Foreign Application Priority Data

Dec. 2, 2008  (KR) .......... 10-2008-0121232
Mar. 20, 2009 (KR) .......... 10-2009-0023897

(51) Int. Cl.
*H03L 7/085* (2006.01)
*H03L 7/095* (2006.01)
*H03L 7/18* (2006.01)
*H03L 7/081* (2006.01)

(52) U.S. Cl. ......... 331/16; 331/17; 331/25; 331/DIG. 2; 455/260

(58) Field of Classification Search .............. 331/1 A, 331/8, 16–18, 25, DIG. 2; 327/156–159; 329/325; 332/127; 360/51; 375/376; 455/260
See application file for complete search history.

(56) References Cited

U.S. PATENT DOCUMENTS

| 7,592,874 B2 * | 9/2009 | Wicpalek et al. ............. 331/25 |
| 2003/0184394 A1 | 10/2003 | Lin et al. |
| 2010/0134160 A1 * | 6/2010 | Min et al. ..................... 327/156 |

OTHER PUBLICATIONS

William B. Wilson et al., "A CMOS Self-Calibrating Frequency Synthesizer", IEEE Journal of Solid-State Circuits, Oct. 10, 2000, pp. 1437-1444, vol. 35, No. 10.

\* cited by examiner

*Primary Examiner* — David Mis

(57) ABSTRACT

A frequency calibration loop circuit having a pre-set frequency channel word (FCW) command value, a bit inputted to obtain a target frequency in an oscillator and a pre-set minimum division ratio n (n is a constant) of a programmable divider, includes: an oscillator adjusting an oscillation frequency of an oscillation signal according to a control value; a programmable divider dividing the oscillation signal according to a division ratio to output a divided signal; a counter counting the number of clocks of the divided signal for one cycle of a reference signal to output a count value; and a frequency detector obtaining the control value by subtracting the count value from a reference comparison value, wherein the reference comparison value is obtained by dividing a Frequency Channel Word (FCW) command value by a minimum division ratio of the programmable divider.

11 Claims, 3 Drawing Sheets

FREQUENCY CALIBRATION LOOP CIRCUIT

CROSS-REFERENCE TO RELATED APPLICATIONS

This application claims the priority of Korean Patent Application No. 2008-121232 filed on Dec. 2, 2008, in the Korean Intellectual Property Office, the disclosure of which is incorporated herein by reference.

BACKGROUND OF THE INVENTION

1. Field of the Invention

The present invention relates to a frequency calibration loop circuit applicable to a frequency synthesizer and, more particularly, to a frequency calibration loop circuit capable of rapidly shifting the oscillation frequency of an oscillator to a target frequency band desired by a user.

2. Description of the Related Art

A frequency synthesizer is commonly used to generate a stable frequency for transmission and reception in the mobile communications sector.

A frequency calibration loop circuit enables the oscillation frequency of an oscillator in a broadband frequency synthesizer to be rapidly shifted to a target frequency band, thus shortening the time taken for the lock loop of the frequency synthesizer to lock.

As the related art digital frequency calibration loop circuit for broadband tuning, an adaptive frequency calibration loop circuit has been used. The adaptive frequency calibration loop circuit may include an oscillator, a main distributor, a frequency detector, and a state machine. The output frequency of the oscillator is controlled by an input bit, and the output frequency increases linearly according to an increase in a digital control value. The main distributor divides a waveform of the oscillation frequency output from the oscillator to generate a divisional signal. The frequency detector is configured as a counter that calculates the difference between the number of clocks of a reference frequency and that of a division frequency during an n clock of the reference frequency. The state machine receives the difference value of the clock numbers of the frequency detector during the n clock of the frequency period to determine a frequency state between the reference frequency and the division frequency to readjust the output bit. By repeatedly performing this process, the output frequency of the oscillator is shifted to a frequency by the product of the distribution value of the main distributor and the reference frequency.

However, the frequency calibration loop circuit readjusts the input bits of the oscillator by simply detecting the state of the frequency difference by means of the state machine. Thus, if the input bits for the frequency calibration of the oscillator are large, it takes an excessive amount of time to shift to a target frequency band.

SUMMARY OF THE INVENTION

An aspect of the present invention provides a frequency calibration loop circuit capable of rapidly shifting a frequency to a target frequency band.

According to an aspect of the present invention, there is provided a frequency calibration loop circuit including: an oscillator adjusting an oscillation frequency of an oscillation signal according to a control value; a programmable divider dividing the oscillation signal according to a division ratio to output a divided signal; a counter counting the number of clocks of the divided signal for one cycle of a reference signal to output a count value; and a frequency detector obtaining the control value by subtracting the count value from a reference comparison value, wherein the reference comparison value is obtained by dividing a Frequency Channel Word (FCW) command value by a minimum division ratio of the programmable divider, wherein the FCW command value is pre-determined to make the oscillation frequency to a target frequency.

The programmable divider may determine the division ratio according to the count value.

If the minimum division ratio is n, the programmable divider may have a division ratio ranging from n to 2n−1.

The frequency calibration loop circuit may further include: a loop filter averaging the control values output from the frequency detector to obtain an average value, and output the average value to the oscillator. And the loop filter may be implemented as a low pass filter.

The frequency calibration loop circuit may further include: a lock discriminator determining whether or not the oscillation frequency has been shifted to a target frequency band based on the control value output from the frequency detector. And the lock discriminator may determine whether or not the oscillation frequency is within a tolerance frequency range of the target frequency by counting the number of times that the frequency detector continuously outputs 0 at every rising edge of the reference signal.

The programmable divider may divide the oscillation signal by one time with a first value obtained by adding a remainder when an integer value of the FCW command value is divided by the minimum division ratio to the minimum division ratio, and divide the oscillation signal by (p−1) time with the minimum division ratio, wherein the p is a quotient when the FCW command value is divided by the minimum division ratio.

The counter may include: a flipflop receiving the reference signal and the divided signal as input signals; a counting unit receiving an output signal from the flipflop as a reset signal and receiving the divided signal as a clock signal; and a latch receiving an output of the counting unit and the reference signal, and output the count value.

If the control value is a negative value, the oscillator may decrease the oscillation frequency, and if the control value is a positive value, the oscillator may increase the oscillation frequency.

The FCW command value and the minimum division ratio may be pre-set by a user.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
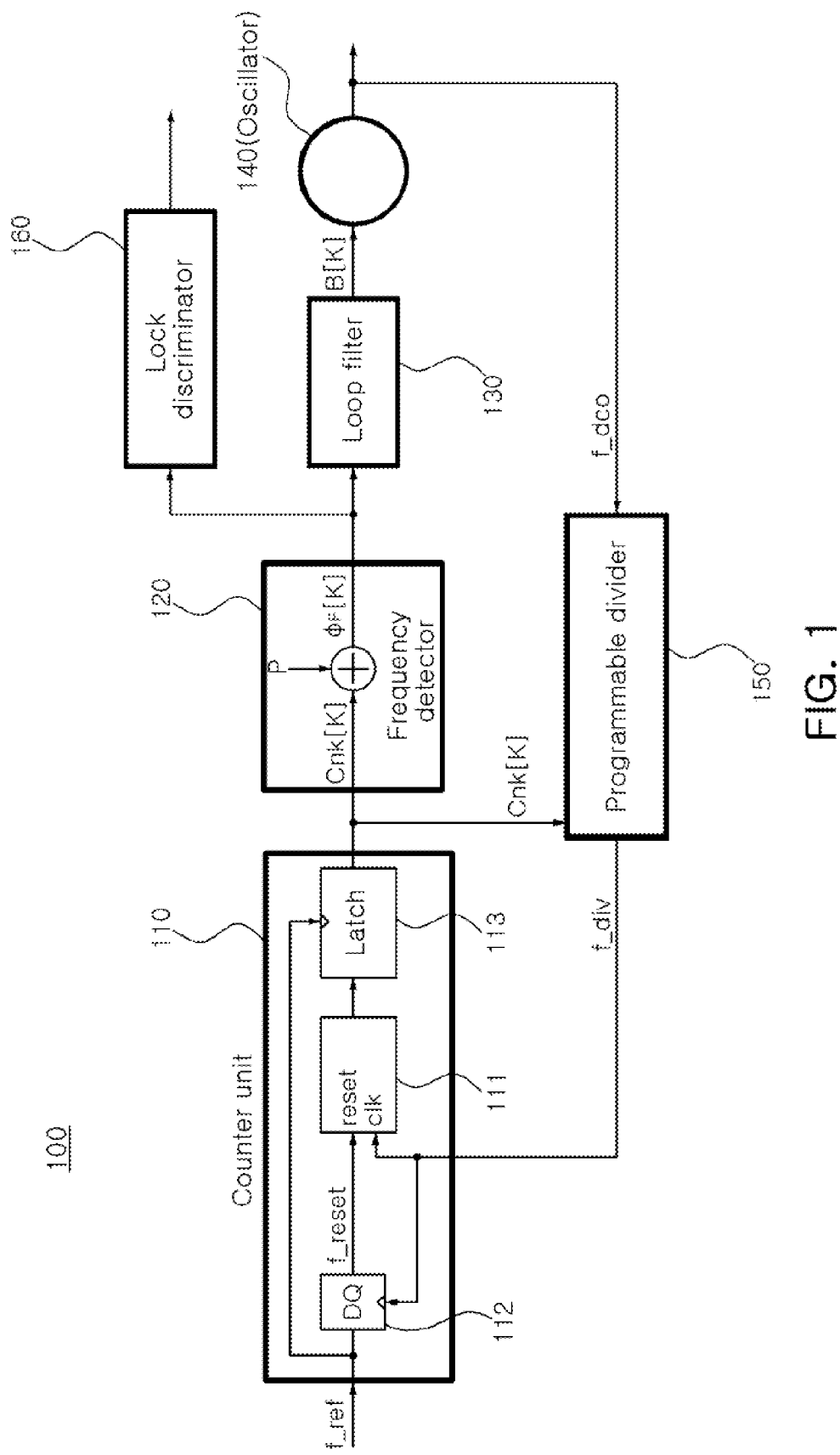
FIG. 1 is a schematic block diagram of a frequency calibration loop circuit according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a schematic block diagram of a frequency calibration loop circuit according to an exemplary embodiment of the present invention.

With reference to FIG. 1, a frequency calibration loop circuit 100 according to an exemplary embodiment of the present invention includes a counter 110, a frequency detector 120, an oscillator 140, and a programmable divider 150 so as to form a frequency calibration loop.

In the frequency calibration loop circuit 100 according to the present exemplary embodiment, a frequency channel word (FCW) command value and a minimum division ratio (n) (n is a constant), which are to be input to obtain a target frequency from the oscillator 140, may be previously set.

The oscillator 140 may be a voltage controlled oscillator (VCO) or a digitally controlled oscillator (DCO). An oscillation frequency output from the oscillator 140 is fed back via the programmable divider 150 and passes through the counter 110 and the frequency detector 120 to control again the oscillator 140, thus forming the frequency calibration loop circuit.

The programmable divider 150 may divide the oscillation frequency (f_dco). In the present exemplary embodiment, the programmable divider 150 may have a division ratio ranging from the pre-set minimum division ratio (n) to 2n−1. The programmable divider 150 may divide the oscillation frequency (f_dco) with one selected from the division ratios.

In this embodiment, the division ratio of the programmable divider 150 may be determined by a value (Cnk[K]) output from the counter 110.

The FCW command value may include an integer part and a decimal part. In this embodiment, the frequency calibration loop circuit may be configured by using only the integer part of the FCW command value.

If the frequency calibration loop in the frequency calibration loop circuit 100 is locked, namely, when oscillation frequency (f_dco) is fixed, dividing at the programmable divider 150 may be represented by Equation 1 shown below:

$$W = n(p-1) + (n+c) \quad \text{[Equation 1]}$$

Herein, 'W' is the pre-set FCW command value, 'n' is the pre-set minimum division ratio, 'c' is the remainder when the FCW command value (W) is divided by the minimum division ratio (n). The reference comparison value (p) as a reference in the frequency detector can be calculated.

Accordingly, under the assumption that the frequency calibration loop of the frequency calibration loop circuit 100 is locked, the programmable divider 150 may divide the oscillation frequency (f_dco) by (p−1) time with the division ratio (n) and divide the oscillation frequency (f_dco) by one time with a division ratio (n+c). Therefore, 'p' may indicate the number of division operations performed by the programmable divider 150.

The counter 110 may receive the divided frequency (f_div) of the programmable divider 150 and the reference frequency (f_ref), measure the number of clocks (Cnk[k]) of the divided frequency (f_div) during one period of the reference frequency (f_ref), and output the measured number of clocks.

In this embodiment, the counter 110 may include a flipflop 112 that receives the reference frequency (f_ref) and the divided frequency (f_div) as input signals, a counting unit 111 that receives an output signal from the flipflop 112 as a reset signal and receives the divided frequency (f_div) as a clock signal, and a latch 113 that receives an output from the counting unit 111 and the reference frequency (f_ref) and outputs the number of clocks.

The flipflop 112 may receive the reference frequency (f_ref) and the divided frequency (f_div) of the programmable divider 150 so as to be re-timed to output a counter reset signal (f_reset).

The counting unit 111, which may be an up-counter, may be reset when the counter reset signal (f_reset) is changed from 0 to 1 (low to high), to count the number of clocks of the divided frequency (f_div) during one period of the reset signal (f_reset) until such time as it is reset.

The number (Cnk[K]) counted by the counting unit 111 is the number of clocks of the divided frequency (f_div) output from the programmable divider 150 during one period of the reference frequency (f_ref), and a signal output from the counting unit 111 may be input to the frequency detector 120 via the latch 113.

The frequency detector 120 may output a value obtained by subtracting the number of clocks (Cnk[K]) output from the counter 110 from the reference comparison value (p), i.e., the integer value of the value obtained by dividing the FCW command value by the minimum division ratio (n), as a control value of the oscillator 140. The reference comparison value (p) may be calculated by Equation 1 shown above.

In this exemplary embodiment, if the control value has a negative value, it means that the divided frequency (f_div) is faster than the reference frequency (f_ref), and in this case, the oscillator 140 may adjust its output frequency such that it is slower than before by adding the negative control value to a previous control value. Meanwhile, if the control value has a positive value, it means that the divided frequency (f_div) is slower than the reference frequency (f_ref), and in this case, the oscillator 140 may adjust its output frequency such that it is faster than before by adding the positive control value to the previous control value.

In this exemplary embodiment, the frequency calibration loop circuit 100 may further include a loop filter 130 connected between the frequency detector 120 and the oscillator 140.

The loop filter 130 may average control values output from the frequency detector 120 and output the average value to the oscillator 140. The loop filter 130 may be implemented as a low pass filter (LPF). The loop filter 130 may be used to secure the loop stability of the frequency calibration loop circuit 100.

In this exemplary embodiment, the frequency calibration loop circuit 100 may further include a lock discriminator 160 that determines whether or not the oscillation frequency (f_dco) of the oscillator 140 has been shifted to a target frequency band based on the control value output from the frequency detector 120.

When a tolerance frequency range allowed by the user over the target frequency is $\Delta f$, the number of times (N_f0) of outputting 0 as an output ($\Phi_f[K]$) of the frequency detector 120 continuously at every clock of the reference frequency within the tolerance frequency range may be represented by Equation shown below:

$$N\_f0 = (n \times f\_ref)/\Delta f$$

For example, if the minimum division ratio n of the programmable divider 150 is 4 and the tolerance frequency is as much as (i.e., corresponds to) the reference frequency, N_f0 may have a value 4. Namely, if value 0 is generated four times as the output value of the frequency detector 120 continuously at every rising edge of the reference frequency, it means that the oscillation frequency (f_dco) is locked within the tolerance frequency range of the target frequency.

In this manner, in the frequency calibration loop circuit 100 according to the present exemplary embodiment of the present invention, the oscillation frequency (f_dco) of the oscillator 140 may be shifted to the tolerance frequency range of the target frequency so that the frequency calibration loop can form a locked state quickly.

Figure 2:
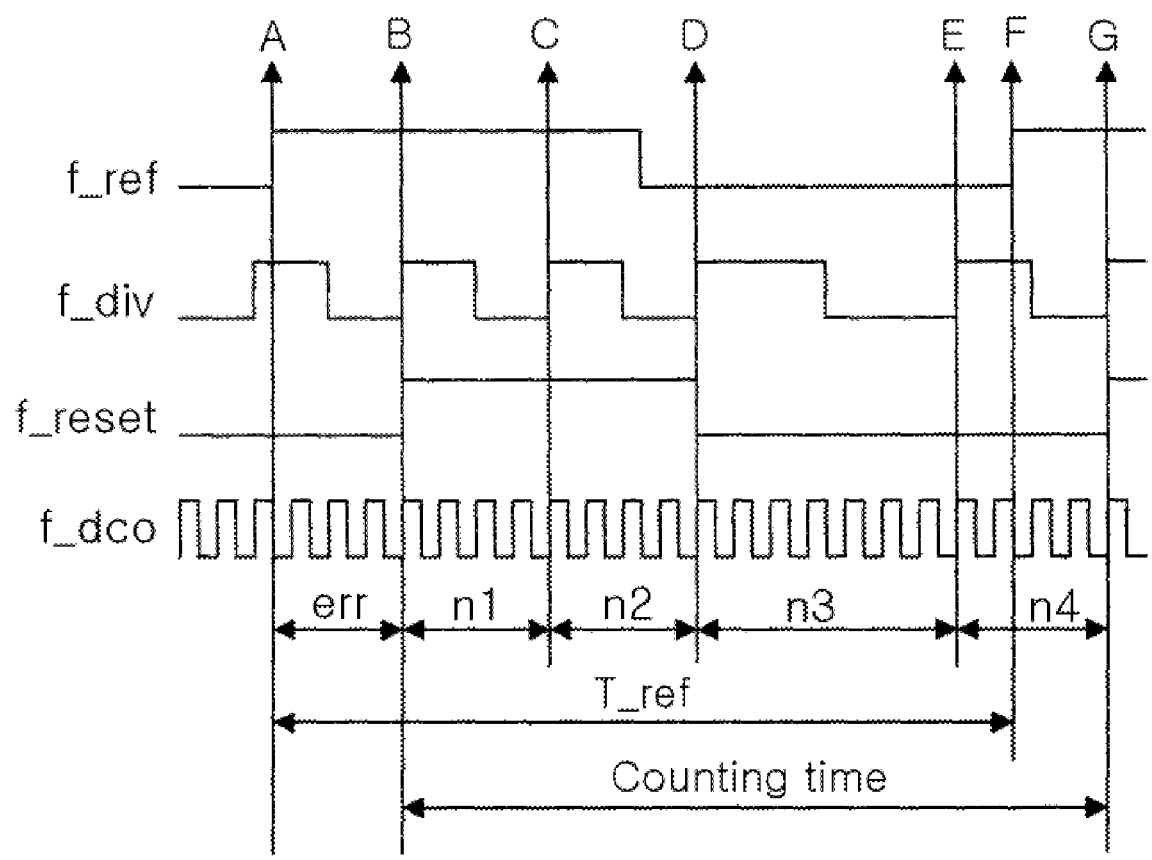
FIG. 2 illustrates frequencies at each stage over time axis in the frequency calibration loop circuit according to the exemplary embodiment of FIG. 1.

FIG. 2 illustrates frequencies at each stage over time axis in the frequency calibration loop circuit according to the exemplary embodiment of FIG. 1. In FIG. 2, T_ref is one period of the reference frequency f_ref, and f_reset indicates a signal generated as the T_ref is re-timed by the divided frequency (f_div) of the programmable divider 150.

In the present exemplary embodiment, the minimum division ratio (n) is 4, and a total of four times of a rising edge of the divided frequency (f_div) divided by the programmable divider 150 may be counted. Meanwhile, the value 'p' is a value obtained by dividing the integer value of the FCW command value by the minimum division ratio (n). If the integer value of FCW command value is 4, three times in 4 correspond to four divisions and one time correspond to seven divisions, so the Cnk[k] value may be 19.

In the present exemplary embodiment, the FCW command value may be set as 19 and the minimum division ratio (n) may be set as 4. Accordingly, the programmable divider 150 may perform four divisions, the minimum division ratio, on the oscillation frequency (f_dco) three times, and seven divisions on the frequency one time. Also, the reference value (p) at the frequency detector 120 may be calculated as 4 according to Equation 1.

With reference to FIGS. 1 and 2, the oscillation frequency (f_dco) of the oscillator 140 may be subject to four divisions (n1, n2, n4) three times and seven divisions (n3) one time by the programmable divider 150.

The divided frequency (f_div) output from the programmable divider 150 may form one clock according to the division of the programmable divider 150.

The flipflop 112 of the counter 110 may receive the divided frequency (f_div) and the reference frequency (f_ref) and output the reset signal (f_reset).

The reset signal (f_reset) shifts from low level to high level at a rising edge (B) of the divided frequency (f_div) in a state that the reference frequency (f_ref) is 1, and shifts from high level to low level at a rising edge (D) of the divided frequency (f_div) in the state that the reference frequency (f_ref) is 0, so as to re-time the clocks of the reference frequency.

The counting unit 111 may receive the reset signal (f_reset) and the divided frequency (f_div) and output the number of clocks of the divided frequency (f_div) during one period of the reset signal.

In the present exemplary embodiment, the counting unit 111 may count 4 times as the divided frequency (f_div) of the programmable divider 150 during an allowed counting time of the reset signal (f_reset).

Accordingly, the value output from the counter 110 and the reference value (p) from the frequency detector 120 are equal, so the output of the frequency detector 120 may be 0.

In FIG. 2, a value 'err' is a phase error between the reference frequency (f_ref) and the reset signal (f_reset). A period value of the output signal (f_dco) of the oscillator 140 at the err interval, is 3.5 and smaller than 4, the minimum division value of the programmable divider 150. The period value of the oscillation frequency (f_dco) at the err interval may be reduced to within the tolerance range by the lock discriminator 160.

Figure 3:
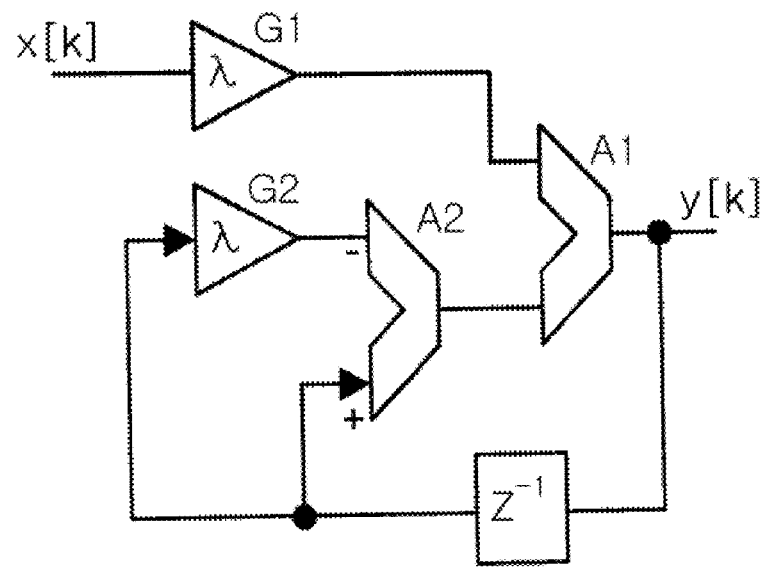
FIG. 3 illustrates a loop filter of the frequency calibration loop circuit according to another exemplary embodiment of the present invention.

FIG. 3 illustrates a loop filter of the frequency calibration loop circuit according to another exemplary embodiment of the present invention. In this exemplary embodiment, the purpose of using the loop filter in the frequency calibration loop circuit is to secure the loop stability of the frequency calibration loop.

A loop filter according to the present exemplary embodiment is digital loop filter and may include a block (G1 and G2) having a gain value λ, an adder block (A1 and A2), and a delay block ($Z^{-1}$).

On the assumption that the reference frequency (f_ref) is used as a clock frequency of the digital loop filter, a transfer function between an input (x[k]) and an output (y[k]) may be represented in an S-domain by equation shown below:

$$H(s)=(1+s/f\_ref)/(1+s/\lambda f\_ref)$$

Figure 4:
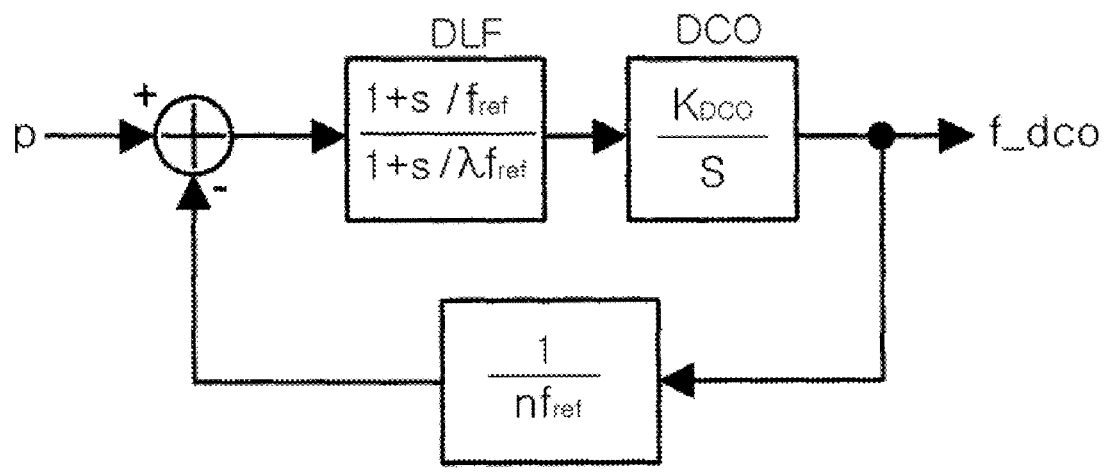
FIG. 4 illustrates a frequency calibration loop circuit configured in an S-domain by using a digital loop filter of FIG. 3.

FIG. 4 illustrates reconfiguration of the frequency calibration loop circuit of FIG. 1 in the S-domain by employing the digital loop filter of FIG. 3 by using the reference value (p) of the frequency detector 120 as a reference input and the output (f_dco) of the oscillator 140 as an output.

When the gain value of the oscillator 140 is defined as $K_{DCO}$, the oscillator 140 may be expressed as an integrator of $K_{DCO}/s$. A transfer function of a closed loop can be obtained by equation shown below:

$$H_{cl}(s) = \frac{pn\lambda K_{DCO} f_{ref}(s + 1/f_{ref})}{s^2 + \lambda(f_{ref} + K_{DCO})s + \lambda K_{DCO} f_{ref}}$$

In the above equation, a denominator term has a pole at a left half plane of the S-domain, so a systematically stable state can be formed by adjusting the loop filter coefficient value or the like.

As set forth above, the frequency calibration loop circuit according to exemplary embodiments of the invention can rapidly shift the oscillation frequency of the oscillator to a target frequency band.

While the present invention has been shown and described in connection with the exemplary embodiments, it will be apparent to those skilled in the art that modifications and variations can be made without departing from the spirit and scope of the invention as defined by the appended claims.

What is claimed is:

1. A frequency calibration loop circuit comprising:
an oscillator configured to adjust an oscillation frequency of an oscillation signal according to a control value;
a programmable divider configured to divide the oscillation signal according to a division ratio to output a divided signal;
a counter configured to count the number of clocks of the divided signal for one cycle of a reference signal to output a count value; and
a frequency detector configured to obtain the control value by subtracting the count value from a reference comparison value,
wherein the reference comparison value is obtained by dividing a Frequency Channel Word (FCW) command value by a minimum division ratio of the programmable divider,
wherein the FCW command value is pre-determined to make the oscillation frequency to a target frequency.

2. The method of claim 1, wherein the programmable divider determines the division ratio according to the count value.

3. The method of claim 1, wherein, if the minimum division ratio is n, the programmable divider has a division ratio ranging from n to 2n−1.

4. The method of claim 2, the method further comprising:
a loop filter configured to average the control values output from the frequency detector to obtain an average value, and output the average value to the oscillator.

5. The method of claim 4, wherein the loop filter is implemented as a low pass filter.

6. The method of claim 1, the method further comprising:
a lock discriminator determining whether or not the oscillation frequency has been shifted to a target frequency band based on the control value output from the frequency detector.

7. The method of claim 6, wherein the lock discriminator determines whether or not the oscillation frequency is within a tolerance frequency range of the target frequency by counting the number of times that the frequency detector continuously outputs "0" at every rising edge of the reference signal.

8. The method of claim 1, wherein the programmable divider is configured to:
divide the oscillation signal by one time with a first value obtained by adding a remainder when an integer value of the FCW command value is divided by the minimum division ratio to the minimum division ratio, and
divide the oscillation signal by (p−1) time with the minimum division ratio, wherein the p is a quotient when the FCW command value is divided by the minimum division ratio.

9. The method of claim 1, wherein the counter comprises:
a flipflop configured to receive the reference signal and the divided signal, as input signals;
a counting unit configured to receive an output signal from the flipflop as a reset signal and receive the divided signal as a clock signal; and
a latch configured to receive an output of the counting unit and the reference signal, and output the count value.

10. The method of claim 1, wherein, if the control value is a negative value, the oscillator decreases the oscillation frequency, and if the control value is a positive value, the oscillator increases the oscillation frequency.

11. The method of claim 1, wherein the FCW command value and the minimum division ratio are pre-set by a user.

* * * * *